United States Patent [19]

Torres

[11] Patent Number: 5,206,608
[45] Date of Patent: Apr. 27, 1993

[54] DRAIN BIAS CIRCUIT FOR HIGH POWER MICROWAVE FIELD EFFECT TRANSISTORS (FETS) HAVING INTERNAL MATCHING

[75] Inventor: Francisco T. Torres, E - Barcelone, Spain

[73] Assignee: Agence Spatiale Europeenne, Paris, France

[21] Appl. No.: 768,849

[22] PCT Filed: Feb. 5, 1991

[86] PCT No.: PCT/FR91/00082
§ 371 Date: Oct. 7, 1991
§ 102(e) Date: Oct. 7, 1991

[87] PCT Pub. No.: WO91/12659
PCT Pub. Date: Aug. 22, 1991

[30] Foreign Application Priority Data
Feb. 6, 1990 [FR] France .................. 90 01342

[51] Int. Cl.⁵ ............................................. H03F 3/60
[52] U.S. Cl. ......................... 330/277; 330/286; 330/297
[58] Field of Search .............. 330/277, 286, 296, 297

[56] References Cited
U.S. PATENT DOCUMENTS
4,277,764 7/1981 Rosier et al. ................. 330/277 X
4,591,803 5/1986 Saleh ................................. 330/277

FOREIGN PATENT DOCUMENTS
0101174 2/1984 European Pat. Off. .
0321046 6/1989 European Pat. Off. .
3234736 1/1984 Fed. Rep. of Germany .

OTHER PUBLICATIONS
Patent Abstracts of Japan, vol. 10, No: 16, (E-375)(2073), Jan. 22, 1986, & JP. A. 60178710 9Nippon Denshin Denwa Kosha), Sep. 12, 1985.
Patent Abstracts of Japan, vol. 2, No: 90 (E-78)(4133), Jul. 22, 1978, & JP, A, 5354454 (Fujitsu), May 17, 1978.
Electronic Components & Application, vol. No: 1, Oct. 1978, "UHF broadband amplifier for transposer vol. IV and V", pp. 43–44, see p. 44; FIG. 2.

Primary Examiner—James B. Mullins
Attorney, Agent, or Firm—Oblon, Spivak, McClelland, Maier & Neustadt

[57] ABSTRACT

A drain bias circuit for a high power FET having internal matching (10) for use in an amplifier operating in the microwave range. The circuit is characterized in that it comprises a transmission line constituted by a low impedance microstrip (20) of length $\lambda g/2$ at the normal operating frequency, where $\lambda g$ is the length of the wave guided by the microstrip (20), and two RF choke coils (9a, 9b) which are connected to the center of the above-mentioned low impedance microstrip transmission line (20), thereby splitting the path of the drain current ($I_D$) into two, which current is thus conveyed to the center of said transmission line, thus making it possible to maintain a load of 50Ω while ensuring that the FET (10) is properly biased.

2 Claims, 2 Drawing Sheets

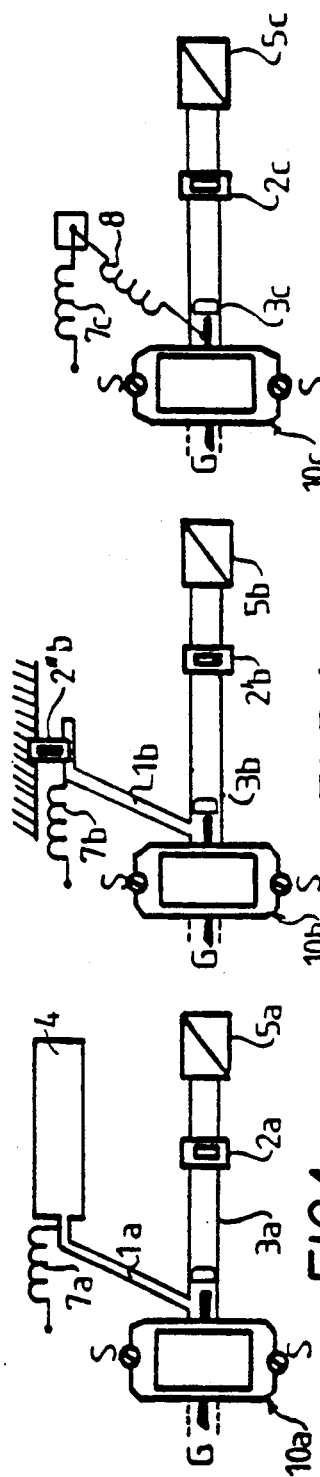
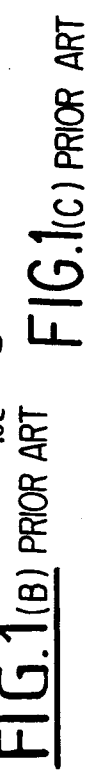
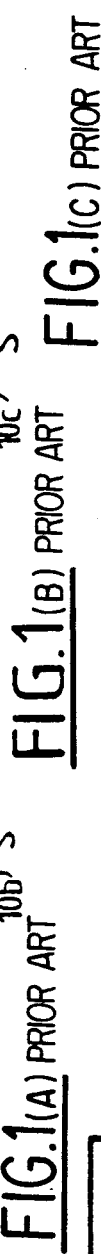
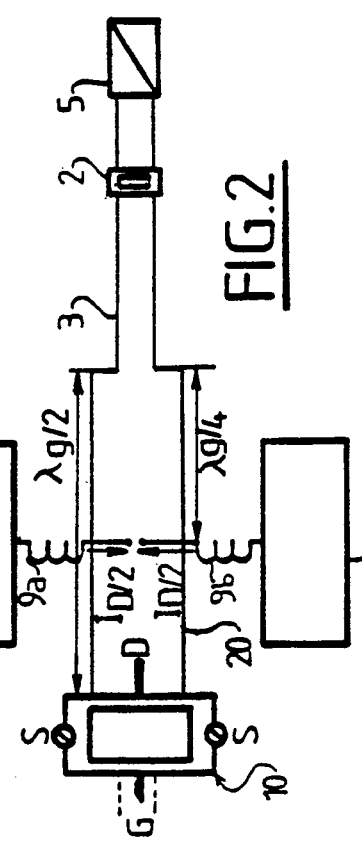
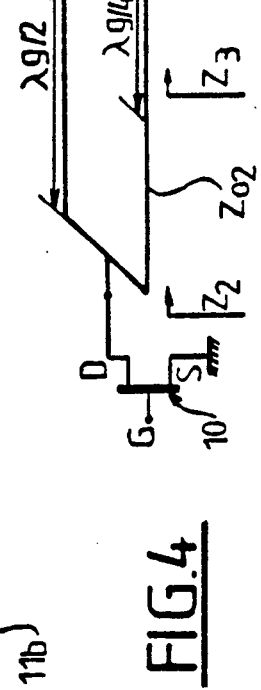
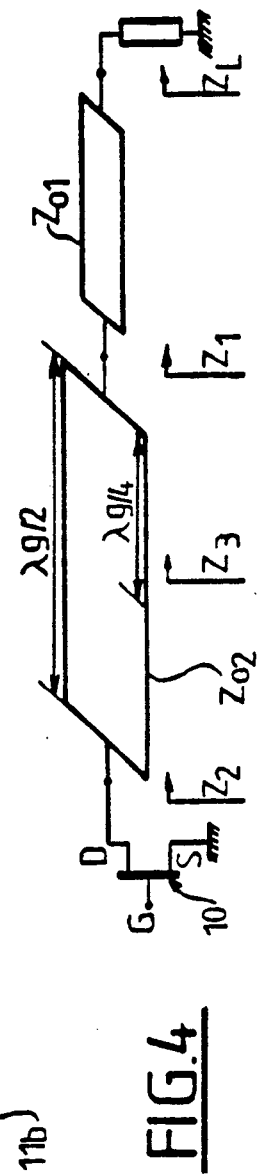

DRAIN BIAS CIRCUIT FOR HIGH POWER MICROWAVE FIELD EFFECT TRANSISTORS (FETS) HAVING INTERNAL MATCHING

FIELD OF THE INVENTION

The present invention relates to a drain bias circuit for high power microwave field effect transistors (FETs), having internal matching.

DESCRIPTION OF THE RELATED ART

Solid state power amplifiers have been significantly improved in recent years and it is expected that more and more of these devices will be used in the future on board satellites. The major advantages of such amplifiers for space applications are due to their high reliability, low mass and small dimensions, high degree of linearity, and improved system flexibility. In this context, high power microwave field effect transistors (FETs) with internal matching have recently appeared on the market as devices which are very compact, very reliable, and which are capable of handling sufficient radiofrequency (RF) power to be suitable for use on board space vehicles.

It should be recalled that when designing a microwave amplifier including an FET device, the drain bias circuit must satisfy the following two fundamental requirements:

1) the FET must be controlled using the appropriate voltage and current corresponding to the selected operating mode; and 2) the effect of the bias circuit on the RF behavior of the circuit must be minimized.

When applied to a power FET having internal matching, these two fundamental conditions can be specified in greater detail, as follows:

1*) the drain bias circuit must process very high currents, which may be of the order of 5 A to 6 A; and 2*) the matching circuit from which the FET is powered is designed in such a manner that optimum behavior of the device is achieved when it includes a load of 50Ω: under such circumstances, that means there is no need for an external matching circuit and the bias circuit must be connected to the RF circuit in such a manner as to give rise to minimal disturbance.

In the context of space vehicle applications, it is clear that reliability is a very important parameter to be taken into consideration when implementing the bias circuit.

FIGS. 1A-1C shows three different approaches that are normally followed when implementing a drain bias circuit (cf. Avantek, Notes on choke network design, AN-A001, June 1986, and Fujitsu Microwave Semiconductors' 88 Application Notes).

FIGS. 1A and 1B are circuits as typically used in low power amplifiers. Drain current is conveyed to the FET 10a or 10b via a respective cable 1a or 1b corresponding to a high impedance λg/4 transmission line which constitutes a very high impedance at the operating frequency for the 50Ω transmission line 3a or 3b. In order to avoid too high a current density along the high impedance transmission line, the drain current is limited to a few hundred mA, thus limiting the power that can be handled by this type of bias circuit.

To fill out the above brief description of the circuits FIGS. 1A and 1B, it should be specified that 2a or 2'b and 2b" represent DC power supply blocks, 4 represents a low impedance transmission line, and 5a or 5b represents a 50Ω load (G, D, and S being the conventional symbols for the electrodes of an FET, namely the gate, the drain, and the source, respectively). The devices 7a or 7b are for biasing purposes together with the high impedance lines 1a or 1b.

To overcome the problem caused by the high impedance line, the circuit of FIG. 1C uses an RF choke coil 8. However, the 50Ω transmission line cannot handle very high control currents and as a result the coil must be connected to the transmission line in such a manner as to be disposed close to the FET. In addition, the size of the link area is comparable to the width of the transmission line, thereby making the reliability of the link very low and making its RF behavior unpredictable.

The other components in the circuit of FIG. 1C correspond to the components in circuits of FIGS. 1A and 1B and they are distinguished therefrom by applying the prefix c to the corresponding numerical references.

SUMMARY OF THE INVENTION

An object of the present invention is thus to design a new drain bias circuit, mainly because the high control current that are necessary for biasing power FETs make the circuits normally used unsuitable for this type of application. In addition, the invention seeks to provide a bias circuit having reliable connections.

The present invention provides a drain bias circuit for a high power FET having internal matching for use in an amplifier operating in the microwave range, the circuit being characterized in that it comprises a transmission line constituted by a low impedance microstrip of length $\lambda g/2$ at the normal operating frequency, where $\lambda g$ is the length of the wave guided by the microstrip, and two RF choke coils which are connected to the center of the above-mentioned low impedance microstrip transmission line, thereby splitting the path of the drain current into two, which current is thus conveyed to the center of said transmission line, thus making it possible to maintain a load of 50Ω while ensuring that the FET is properly biased.

In addition to the above dispositions, the invention also includes other dispositions that appear from the following description.

The invention will be better understood on reading the following additional description which makes reference to the accompanying drawings, in which:

BRIEF DESCRIPTION OF THE DRAWINGS

FIGS. 1A-1C are diagrams of three different prior art drain bias circuits and are described above;

FIG. 2 is a circuit diagram of a circuit of the present invention;

FIG. 3 is the equivalent electrical circuit of a transmission line, enabling its inlet impedance to be calculated;

FIG. 4 is the equivalent electrical circuit of the circuit shown in FIG. 2; and

Figure 5:
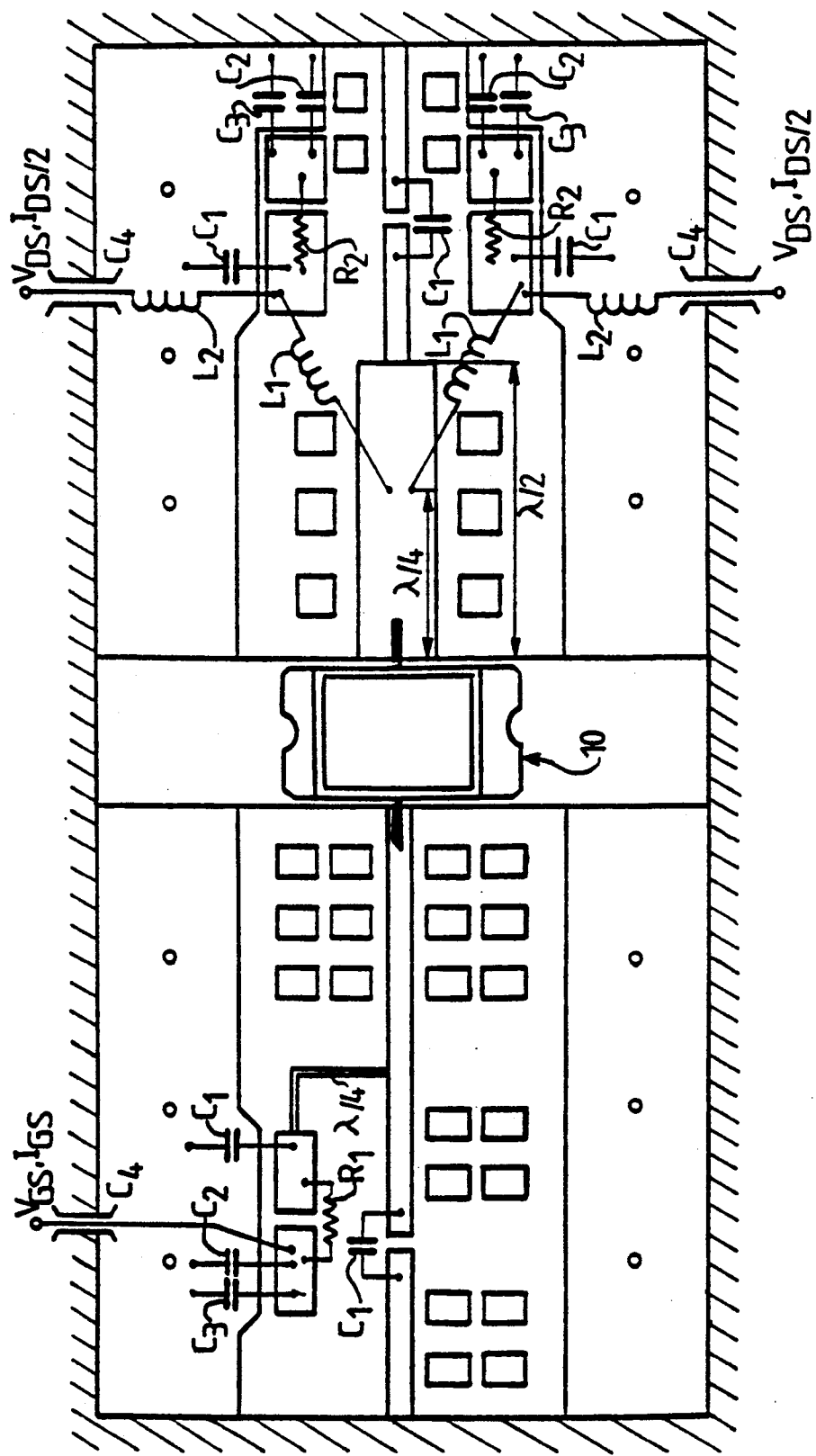
FIG. 5 is a diagrammatic view showing the disposition of the components in an amplifier stage using a power FET and including a bias circuit in accordance with the present invention.

It should nevertheless be understood that the drawings and the corresponding portions of the description are given solely to illustrate the invention and that they do not constitute any kind of limitation thereon.

DETAILED DESCRIPTION OF THE PREFERRED EMBODIMENTS

The drain bias circuit of the invention is implemented by means of a transmission line 20 constituted by a low impedance microstrip of length $\lambda g/2$ at the operating frequency (where $\lambda g$ is the length of the wave guided by the microstrip). The drain current $I_D$ is split between two paths and is conveyed to the FET 10 by means of two coils 9a and 9b which act as RF choke coils and which are connected to the center of the low impedance transmission line 20 (cf. FIG. 2 where numerical references 2, 3, and 5 have the same meanings as in FIG. 1, but with the indices omitted, and where the references 11a and 11b designate circuits for stabilizing the DC feed).

The drain bias circuit proposed by the Applicant enables the FET to be properly biased while maintaining a load of $50\Omega$ (with this load being given numerical reference 5). If the characteristic impedance of the transmission line is written $Z_o$, its length l, and its load $Z_L$, then the input impedance $Z_{in}$ of the transmission line can be calculated using following equation 1) which is derived from the equivalent circuit shown in FIG. 3:

$$Z_{in} = Z_o \frac{Z_L \cdot \cos\beta l + jZ_o \cdot \sin\beta l}{Z_o \cdot \cos\beta l + jZ_L \cdot \sin\beta l} \quad 1)$$

where: $\beta < 2\pi/\lambda g$ and l is the length of the line.

Certain advantageous properties of the FIG. 2 circuit can be deduced by analyzing above equation 1). It should be observed that:

a) if $Z_1 = Z_o$ in the equation, then $Z_{in} = Z_o = Z_L$. This means that in the circuit of FIG. 4 where $Z_L = Z_{o1}$, then $Z_1 = 50\Omega$;

b) if $l = \lambda g/2$, then $Z_{in} = Z_L$ for any value of $Z_o$. This means that the FET in FIG. 4 is loaded by an impedance $Z_2 = Z_1 = 50\Omega$; and c) if $l = \lambda g/4$, then $Z_{in} = Z_o^2/Z_L$ which means that in FIG. 4 where $Z_{o2} = 25\Omega$ at a distance $\lambda g/4$ from the junction between the two transmission lines, the impedance passes a minimum of $Z_3 = 12.5\Omega$.

The effect of the coils on the RF behavior of the circuit is very low because the coils present very high impedance at the normal operating frequency and they are connected to the transmission line constituted by the above-mentioned microstrip in parallel and at a low impedance point thereof.

FIG. 5 is a diagrammatic view showing how components are located in a microwave power amplifier stage operating in class C, and using a Fujitsu power FET reference FLM3742-14 C Band Power. The microstrip circuit is designed to operate at a frequency of 3.95 GHz on EPSILAM 10 (substrate thickness h equal to 50 mm, relative dielectric constant equal to 10.2, thickness of the metal layer equal to 0.035 mm). In class A operation, this device must be biased with 10 V at 5 A. The minimum width of the low impedance transmission line is given by the maximum current density that can be carried by the transmission line:

$$I_{DS} = J_{max} \cdot W_{min} \cdot h$$

in which $J_{max}$ = maximum current density
$W_{min}$ = minimum width of the microstrip.

The maximum width $W_{max}$ is defined by the minimum characteristic impedance specified for the substrate used.

The recommended maximum current density for standard copper is $10^4$ A/cm². It follows that the minimum width of microstrip required for controlling 5 A is 1.4 mm. Using LINECALC ® to calculate the parameters of the microstrip transmission lines gives the following results:

$Z_o = 44.2\Omega$; $\lambda g = 28.5$ mm; $W = 1.4$ mm: $W_{min}$ $Z_o = 25.0\Omega$; $\lambda g = 26.8$ mm; $W = 3.7$ mm: W (selected width)

$Z_o = 15.0\Omega$; $\lambda g = 25.6$ mm; $Z = 7.5$ mm: $Z_{min}$ (recommended).

A mean value in the range of available impedances ($25\Omega$) is selected for the $\lambda g/2$ transmission line. In addition, a microstrip width of 3.7 mm is selected which corresponds to approximately three times the size of the link area and which consequently provides a link that is reliable with low interference for RF behavior.

The meanings of the various symbols used in describing the circuit of the invention are summarized below:

$Z_o$, $Z_{o1}$, $Z_{o2}$:characteristic impedances of transmission lines;

$Z_1$, $Z_2$, $Z_3$, $Z_{in}$:complex impedances;

$\lambda g$:the length of the wave guided by the microstrip;

$I_D$:drain current;

J, $J_{max}$:generic and maximum current density through the microstrip;

l:transmission line length;

W, $W_{min}$, $W_{max}$:current, minimum, and maximum widths of the microstrip;

h:thickness of the metal layer; and $\beta = 2\pi/\lambda g$.

The main advantages of the novel bias circuit described above may be summarized as follows:

i) high control currents: the maximum drain current is no longer limited by microstrip transmission lines since the width of the microstrip can be chosen to be wider merely by reducing the impedance of the $\lambda g/2$ transmission line;

ii) lower RF losses and lower DC losses: in a low impedance metal transmission line the cross-section is greater than in a $50\Omega$ line, thereby reducing its resistance;

iii) reduced RF radiation: a low impedance microstrip transmission line radiates less (reduced dispersion effect). The electric field is mainly concentrated beneath the microstrip, thus avoiding unwanted coupling with the coils or other components of the circuit;

iv) a very reliable circuit: the width of the low impedance transmission line may =selected to be two or three times the size of the link area, thereby providing a link that is more reliable. In addition, the coils are placed at the center of the transmission line far away from any circuit discontinuity, and they are connected in parallel to the microstrip line at a low impedance point, thereby giving rise to minimum interference with the RF behavior of the circuit. In addition, the current density in the microstrip transmission line can be kept well below the maximum allowable value; and v) by splitting the drain current over two paths, two major advantages are obtained: firstly the coils may be manufactured using smaller-diameter wire, thereby reducing their stray capacitance and thus enabling them to be used at higher frequencies; and also the symmetry of the structure prevents higher order from being excited in the microstrip line.

As can be seen from the above, the invention is not limited in any way to the particular embodiments, implementations, and applications described above in detail; on the contrary, the invention covers any variant that may occur to the person skilled in the art without going beyond the context or the scope of the present invention.

I claim:

1. A drain bias circuit for a high power FET having internal matching for use in an amplifier operating in the microwave range, said FET having a gate electrode, a source electrode and a drain electrode, the circuit comprising:

a transmission line constituted by a low impedance microstrip of length $\lambda g/2$ at a normal operating frequency, where $\lambda g$ is the length of a wave guided by the microstrip, one end of the transmission line being connected to the drain electrode; and two RF choke coils which are connected to the center of the low impedance microstrip transmission line, and to a bias power source, each choke coil transmitting half of the drain current to the center of said transmission line, thus making it possible to maintain a load of 50Ω while ensuring that the FET is properly biased.

2. A drain bias circuit for a high power FET having internal matching for use in an amplifier operating in the microwave range, said FET having a gate electrode, a source electrode and a drain electrode, the circuit comprising:

a transmission line having a low impedance microstrip of length $\lambda g/2$ where $\lambda g$ is the wavelength of waves travelling on the microstrip, one end of the transmission line being connected to the drain electrode, the microstrip having a center; and first and second RF choke coil means each for sending one-half of a drain bias current of the FET from a bias current source means to the center of the microstrip.

* * * * *